July 25, 1967 A. A. VALDETTARO 3,333,202

TELEVISION TUNER

Filed Aug. 27, 1963 2 Sheets-Sheet 1

INVENTOR.
ALARICO A. VALDETTARO
BY
Mason, Kolehmainen, Rathburn & Wyss
ATTYS.

TELEVISION TUNER

Filed Aug. 27, 1963

2 Sheets-Sheet 2

INVENTOR.
ALARICO A. VALDETTARO
BY Mason, Kolehmainen, Rathburn & Wyss.
ATTYS.

United States Patent Office 3,333,202

Patented July 25, 1967

3,333,202
TELEVISION TUNER

Alarico A. Valdettaro, Bloomington, Ind., assignor to Sarkes Tarzian, Inc., Bloomington, Ind., a corporation of Indiana Filed Aug. 27, 1963, Ser. No. 304,912
17 Claims. (Cl. 325—459)

The present invention relates to television tuners, and, more particularly, to television tuners wherein simplified facilities are provided for tuning an associated television receiver precisely to a desired television channel and for adapting the receiver for reception of signals in the UHF television band.

In television tuners heretofore proposed, it is customary to provide a so-called fine tuning arrangement for precisely and accurately tuning the local oscillator of the tuner so as to provide the best television reception for each television channel. Such fine tuning arrangements have been employed in both the turret type of television tuner, wherein the tuning coils are mounted on a rotatable drum-like structure and are selectively connected into the associated tuner circuitry, and also in switch type tuners wherein the tuning coils are stationary and are incrementally added to provide tuning inductances for successively lower frequency channels. When a television tuner which is arranged to receive VHF channels is adapted to receive television channels in the UHF television band, it has also been customary to deenergize the local oscillator of the VHF tuner and in many instances this deenergization is performed by removing the B+ voltage from the plate of the oscillator tube in the VHF tuner. While these arrangements have in general been satisfactory for their intended purpose, when the fine tuning function is accomplished by a variable inductance, as is common in many instances, the changeover switching required to convert the VHF tuner for UHF reception by removing B+ from the local oscillator tube is quite complicated due to the fact that the fine tuning inductance is a current carrying device and is normally connected across the tuning inductances in the local oscillator circuit. Also, in switch type tuners a common switching position is required in addition to the twelve VHF positions and this common pole falls at the position it is desired to establish connections for UHF reception.

Various expedients have been proposed for switching over from VHF to UHF reception. One such arrangement has provided a separate wafer switch which is mounted on the rear of the tuner and has sufficient contacts to remove B+ from the local oscillator tube of the VHF tuner and switch the input of the VHF tuner from the VHF antenna circuit to the IF signal developed by a preceding UHF tuner. In addition, this so-called function switch on the rear of the tuner has supplied a B+ potential to the local oscillator tube for the UHF tuner since the UHF tuner is required to function only during periods of UHF reception. In other arrangements the above described switching functions have been distributed among the various switch wafers in a switch type tuner, some of these functions being performed by the input wafer of the switch tuner, or an auxiliary wafer adjacent the input wafer, and other functions being performed by the local oscillator switch wafer of the switch type tuner. These auxiliary switching arrangements necessarily require additional switching components, connectors and additional circuit components which inherently increase the cost of the tuner substantially. This is particularly true in instances where a fine tuning inductance is employed which must be blocked by a suitable blocking condenser for UHF reception in those instances where the B+ voltage to the local oscillator tube of the VHF tuner is removed during UHF reception.

In television tuners which employ a variable fine tuning inductance, an additional problem arises due to the fact that the same fine tuning inductance is used for all VHF television channels. Since this inductance has a fixed range of variation, adjustment of this fine tuning inductance will produce different frequency variations in the high and low frequency VHF television bands. For example, the fine tuning inductance may give a variation in the local oscillator frequency of 5 megacycles on channel 2, i.e., the lowest frequency channel and provide only three megacycles variation in the local oscillator frequency for channel 13, i.e., the highest frequency VHF television channel. It is, therefore, desirable to provide a variable fine tuning inductance arrangement which is effective to vary the frequency of the local oscillator circuit by a substantially fixed amount in all of the VHF television channels.

It is, therefore, an object of the present invention to provide a new and improved television tuner wherein one or more of the above described disadvantages of prior art arrangements is avoided.

It is another object of the present invention to provide a new and improved television tuner wherein simplified fine tuning facilities are provided which facilitate adaption of the tuner for UHF television reception.

It is a further object of the invention to provide a new and improved television tuner wherein a simplified fine tuning circuit arrangement is provided.

It is another object of the present invention to provide a new and improved television tuner wherein a variable fine tuning inductance is employed which is connected in series with the oscillator tuning circuits in such manner that a simplified local oscillator circuit is provided.

It is still another object of the present invention to provide a new and improved television tuner of the turret type wherein adaption of the tuner for UHF reception is accomplished without employing separate or auxiliary switch wafers to accomplish the switching functions.

It is a further object of the present invention to provide a new and improved switch type television tuner wherein adaption for UHF reception is accomplished without requiring additional auxiliary switch wafers.

Another object of the present invention resides in the provision of a new and improved television tuner wherein a variable fine tuning inductance is employed which is effective to vary the frequency of the local oscillator circuit of the tuner by a substantially fixed amount in all VHF television channels.

It is a still further object of the present invention to provide a new and improved television tuner wherein a selector switch arrangement is employed which is particularly adapted to provide the necessary switching functions for adaption of the tuner to UHF reception in a simplified and economical manner.

The invention, both as to its organization and method of operation, together with further objects and advantages thereof, will best be understood by reference to the following specification taken in connection with the accompanying drawings in which.

Figures 1, 2:
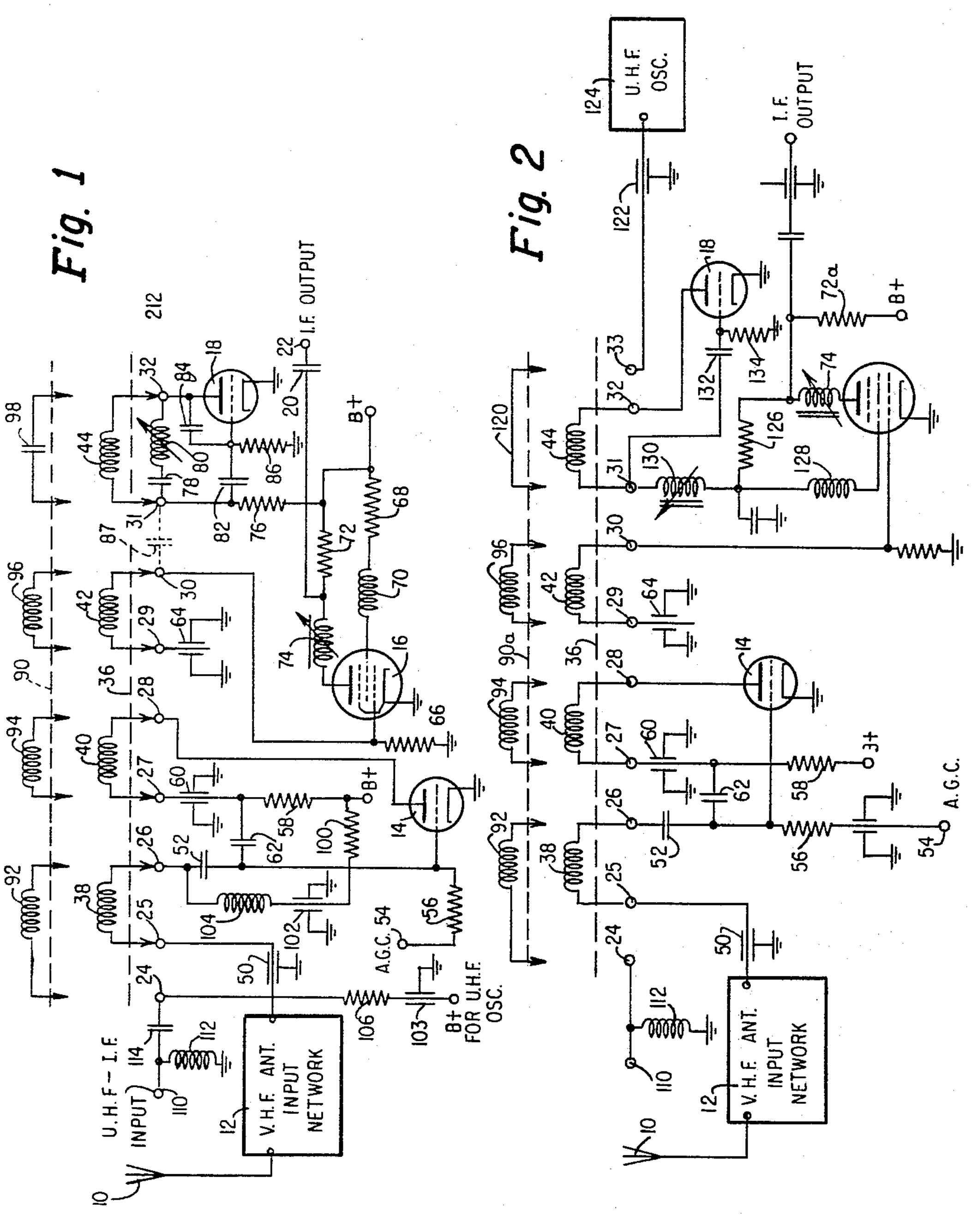
FIG. 1 is a schematic diagram of a turret type television tuner embodying certain features of the present invention.
FIG. 2 is a schematic diagram of a turret type television tuner embodying other features of the invention.

Referring now to the drawings and more particularly to FIG. 1 thereof, the present invention is therein illustrated as comprising a VHF antenna circuit indicated generally at 10 which is connected to a VHF antenna input circuit 12 the output of which is arranged to be supplied to the control grid of an RF amplifier tube 14. The output of the amplifier tube 14 is supplied to the control grid of a mixer tube indicated generally at 16 and a local oscillator tube 18 is employed to develop local oscillations which are also supplied to the grid of the tube 16 so that an intermediate frequency output signal is provided by heterodyne action in the plate circuit of the tube 16, this IF signal being supplied through a condenser 20 to the IF output terminal 22.

The television tuner of FIG. 1 is of the turret type and includes a number of stator contacts 24 to 32, inclusive, which are arranged to be engaged by different sets of contacts on a rotatable turret, these different sets of contacts corresponding to different television channels. For example, the turret drum is provided with a group of 12 panels of insulating material corresponding to VHF television channels 2 to 13, inclusive, one such channel being indicated by the dotted line 36 in FIG. 1. The panel 36 carries a first tuning coil 38 which is arranged to tune the input circuit of the radio frequency amplifier tube 14, a second coil 40 which is arranged to tune the plate circuit of the RF tube 14, a third coil 42 which is arranged to couple the RF signal from the plate of the tube 14 to the grid of the tube 16 and to tune the grid circuit of the tube 16 and a coil 44 which is arranged to tune the oscillator tube 18 to the desired local oscillator frequency. Each of the coils 38, 40, 42 and 44 is provided with a pair of contacts which engage particular ones of the stator contacts in the manner shown in FIG. 1 when the panel 36 is moved to the corresponding channel position.

Briefly considering the operation of the tuner of FIG. 1 for VHF reception, a VHF television signal which is received by the antenna 10 is coupled through the input circuit 12 with suitable impedance transformation and is applied through a feedthrough capacitor 50, the coil 38 and a condensor 52 to the grid of the RF tube 14. The coil 38, the capacitor 50 and the associated circuit capacity connected to the terminal 26 provides a suitable band pass tuned circuit which is tuned to the frequency of the television channel corresponding to the panel 36 so that only signals corresponding to this particular television band are applied to the grid of the tube 14 and are amplified in this tube. The grid of the tube 14 is connected to an automatic gain control terminal 54 through a resistor 56 so that the gain of the tube 14 may be controlled from the television receiver proper in accordance with an automatic gain control voltage, as will be readily understood by those skilled in the art. The plate circuit of the tube 14 is tuned, by means of the coil 40 and the distributed circuit capacities, to the desired television channel and a B+ voltage for the plate of this tube is applied through a resistor 58 and a feedthrough capacitor 60 to the stator terminal 27. In addition, a capacitor 62 is connected between the terminal 27 and the grid of the tube 14 to provide triode neutralization.

The amplified RF signal developed in the plate circuit of the tube 14 is coupled to the coil 42 which is tuned by means of the capacitor 64 and is coupled to the control grid of the mixer tube 16, this control grid being connected to ground through a grid leak resistor 66. Screen voltage for the tube 16 is supplied from the B+ terminal through a dropping resistor 68 and a compensation coil 70 and plate voltage for the plate of the mixer tube 16 is supplied through a resistor 72 and a variable tuning coil 74 which is tuned to the intermediate frequency of the tuner of FIG. 1, so that an IF signal of this frequency is supplied to the terminal 22.

The local oscillator tube 18 is supplied with B+ voltage through a resistor 76 from the B+ terminal and through the coil 44 to the plate of the tube 18. A capacitor 78 is connected in series with a variable fine tuning inductance 80 between the stator terminals 31 and 32, and a pair of capacitors 82 and 84 connected across these terminals are arranged to provide the feedback connection to the oscillator grid of the correct value to sustain oscillations in this tube, the grid of this tube being connected to ground through a resistor 86. Oscillations developed in the tank circuit of the oscillator 18 are coupled to the grid of the mixer tube 16 through the capacity between stator contacts 30 and 31, indicated in dotted lines in FIG. 1 as the capacitor 87.

In order to adapt the tuner of FIG. 1 for UHF reception, there is provided a thirteenth panel of insulating material indicated generally by the dotted line 90 which carries a plurality of coils 92, 94 and 96 and a capacitor 98. When the tuner is to be adapted for UHF reception the station selector shaft of the tuner is turned so that the contacts carried by the panel 90 are moved into engagement with selected ones of the stator contacts 24 to 32, inclusive. More particularly, in the UHF position the coil 92 is connected between the stator terminals 24, 26, the coil 94 is connected between the stator terminals 27, 28, the coil 96 is connected between the stator terminals 29, 30 and the condenser 98 is connected between the stator terminals 31 and 32.

In accordance with an important aspect of the present invention, when the panel 90 is moved into operative relationship with the stator contacts of the tuner, a circuit is set up for supplying a B+ voltage to the oscillator of the associated UHF tuner without requiring extra switching circuitry for this function. More particularly, a B+ voltage is supplied to the stator contact 26 through a dropping resistor 100, feedthrough bypass capacitor 102 and choke coil 104. When the panel 90 is moved into operative relationship with the stator contact 26 the coil 92 carries the B+ voltage to the terminal 24 and this voltage is then supplied through a resistor 106 and a feedthrough capacitor 103 to the plate circuit of the UHF oscillator. At the same time, the IF signal developed by the associated UHF tuner is applied to the input terminal 110 of the tuner of FIG. 1. In this connection it will be understood that the associated UHF tuner may comprise any suitable arrangement for receiving the present band of UHF stations and converting a selected one of these stations to a suitable IF frequency which is applied to the terminal 110. A tuning coil 112 is connected from the terminal 110 to ground so as to complete the current path in the UHF tuner IF output circuit. A coupling capacitor 114 is connected from the terminal 110 to the stator contact 24. Accordingly, the coil 92 not only carries the B+ voltage for the UHF oscillator tube but also acts as a tuning inductance to tune the input circuit of the RF tube 14 to the IF frequency of the UHF tuner and transmits this IF signal to the grid of tube 14. This IF signal is, during UHF reception, amplified in the tube 14 and supplied to the grid of the mixer tube 16 which is also operated as an amplifier for this intermediate frequency. To this end, the coils 94 and 96 are both tuned with associated circuit capacities, to the UHF–IF frequency.

The oscillator tube 18 has its plate voltage removed in the UHF position due to the fact that the condensor 98 is connected between the stator contacts 31 and 32 in place of the coil 44 and this capacitor functions to block the B+ voltage. Accordingly, the tube 18 is deenergized and no local oscillator signal is developed. There is therefore produced at the terminal 22 an IF output signal which has been amplified through the tubes 14 and 16. The capacitor 98 is of such value that when combined with the capacitor 78 and the fine tuning inductance 80 the frequency of this resonant circuit is out of the range of the UHF–IF frequency so that the resonant circuit formed by these components does not introduce undesired spurious resonances.

It will thus be seen that the arrangement of FIG. 1 provides a suitable switching arrangement for disconnecting the VHF antenna input circuit from the input of the tube 14, connecting the UHF–IF output from the preceding UHF tuner to the input of the tube 14 and removing B+ voltage from the oscillator tube 18 so that this tube is deenergized. Furthermore, all of these switching functions are performed by merely providing one additional stator contact, i.e., the contact 24 on the tuner. It will also be noted that by employing the choke 104, a B+ voltage of substantial magnitude is available at the terminal 24 for application to the plate of the UHF oscillator tube. Accordingly, the value of the resistor 106 may be varied as desired to accommodate oscillator tubes requiring different values of plate voltage.

In FIG. 2 there is shown an alternative embodiment of the invention wherein a turret type television tuner is adapted for UHF reception. In the tuner of FIG. 2 a number of the tuner components are the same as the embodiment of FIG. 1 and hence have been given corresponding reference numerals. However, in the embodiment of FIG. 2 the coil 92 carried by the UHF panel **90*a* is not employed to supply B+ to the oscillator tube of the associated UHF tuner. Instead, another stator contact 33 is provided in the tuner of FIG. 2 and when the panel 90*a* is switched into operative position, a connection provided by the wire 120 is established between the stator terminals 31 and 33. The stator terminal 33 is connected through a suitable feedthrough capacitor 122 to the plate of the oscillator tube of the associated UHF tuner indicated generally at 124**.

In the tuner of FIG. 2 the B+ voltage for the plate of the mixer tube 16 is supplied through a resistor **72*a* and the IF tuning coil 74. Also, screen voltage is supplied through a resistor 126 and a compensating coil 128 from the junction of the resistor 72*a* and the coil 74. However, plate voltage for the oscillator tube 18 is derived from the screen circuit of the mixer tube 16. More particularly, from the junction of the resistor 126 and the coil 128 a variable fine tuning inductance 130 is connected to the stator terminal 31, and a condenser 132 is connected from this junction point to the grid of the oscillator tube 18, this grid being connected to ground through a grid leak resistor 134. During VHF reception the oscillator tube 18 is tuned to the desired local oscillator frequency by means of the tuning coil 44 and the associated variable fine tuning inductance 130. Since the lower end of the inductance 130 is essentially grounded insofar as alternating currents are concerned and the coil 44 will have a virtual ground somewhere along the length of this coil, the fine tuning inductance 130 is essentially connected across only a portion of the coil 44. Accordingly, variation of the inductance 130, which may be accomplished by means of a separate knob connected to the variable member of the inductance 130, changes the value of the total inductance in the plate circuit of the oscillator tube 18 and hence varies the frequency of oscillations. Furthermore, since a different coil is substituted for each of the VHF channels 2 to 13, inclusive, the position of the virtual grounds for each of these coils will remain essentially the same so that the frequency range provided by variation of the tuning inductance 130 remains substantially constant throughout the VHF television band. Furthermore, when the station selector shaft of the tuner of FIG. 2 is moved to the UHF position, the B+ voltage appearing at the junction of the resistor 126 and the coil 128 in the screen circuit of the tube 16 is supplied through the fine tuning inductance 130 and the connecting wire 120 to the terminal 33 so that a B+ voltage of substantial magnitude is supplied to the plate of the oscillator tube in the UHF tuner 124. A suitable dropping resistor may be employed in the UHF tuner 124 to drop the value of B+ voltage to the correct operating value for the particular type of oscillator tube used in the UHF tuner 124. It will also be noted that in the embodiment of FIG. 2 the capacitors 78 and 84, used in the tuner of FIG. 1, have been eliminated while still providing an arrangment which is effective to remove the B+ voltage from the oscillator tube 18 since the stator terminal 32** is completely disconnected in the UHF position.

In the tuner of FIG. 2 the antenna input switching is effected in the same manner as the embodiment of FIG. 1. Thus, the coil 92 is arranged to connect the stator contact 24 to the stator contact 26 in the UHF position and the coil 92 is tuned to the IF frequency of the UHF tuner so that this IF signal is applied to the input of the RF tube 14. However, the coil 92, in the embodiment of FIG. 2, does not supply B+ voltage to the UHF oscillator tube, this function being performed by the stator contact 33 and the circuit arrangement described in detail heretofore.

Figures 3, 4:
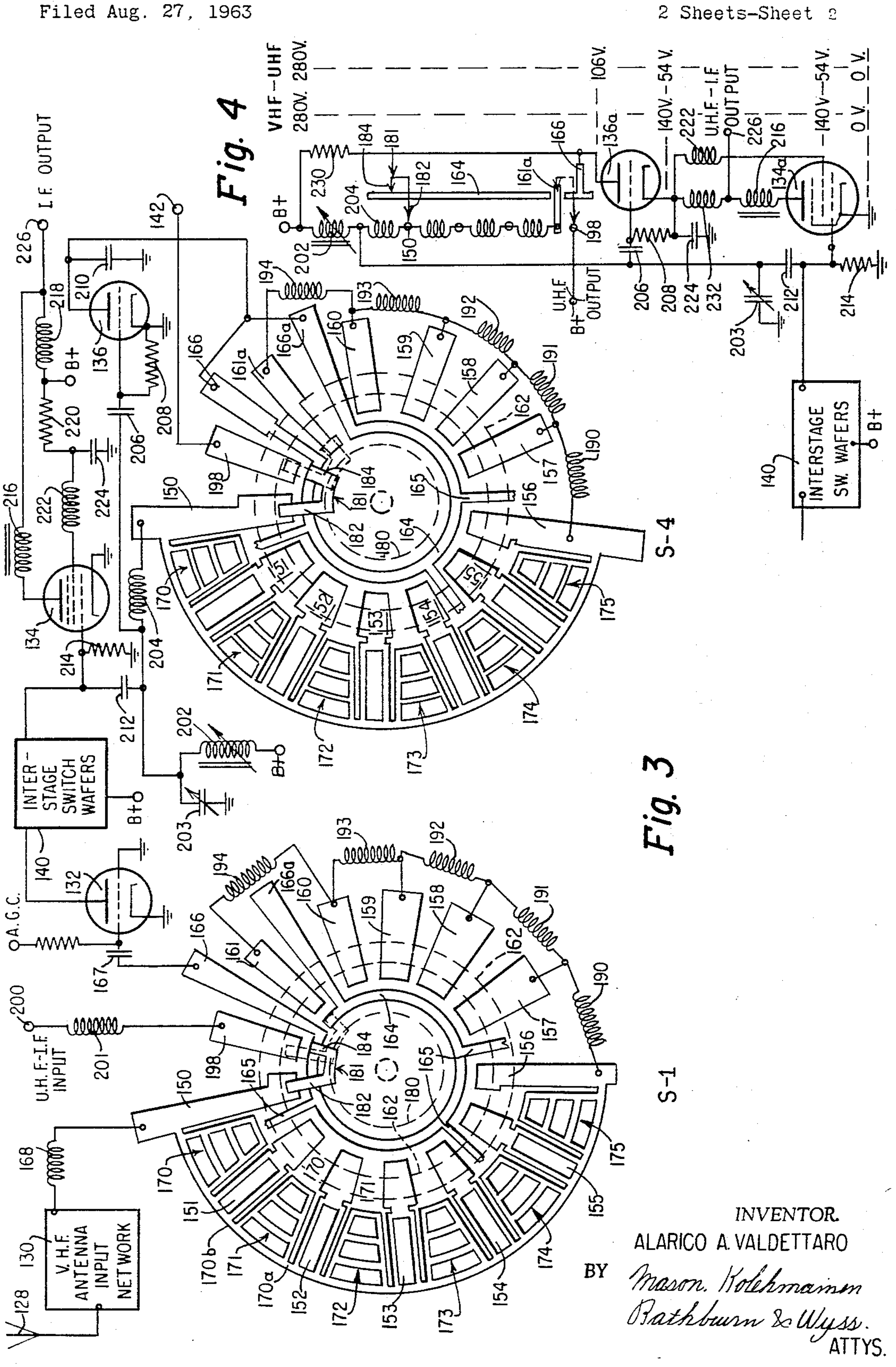
FIG. 3 is a schematic diagram, partly in diagrammatic form, of a switch-type television tuner embodying features of the present invention.
FIG. 4 is a schematic diagram of a portion of a switch type television tuner embodying further features of the invention wherein the mixer and oscillator tubes are connected in series to the B+ supply voltage.

In FIG. 3 of the drawings, there is shown a switch type television tuner which embodies certain additional features of the present invention. Referring to this figure, the VHF antenna 128 is connected to an antenna input network 130 and the tuner utilizes an RF amplifier tube 132, a mixer tube 134 and an oscillator tube 136. A first switch wafer S–1 is employed to connect the antenna input network 130 to the control grid of the RF amplifier tube 132 and a pair of switch wafers are employed to interconnect the plate circuit of the tube 132 with the control grid of the mixer tube 134, these switch wafers being indicated generally by the block 140. A fourth switch wafer S–4 is employed to alter the frequency of the local oscillator 136 corresponding to each of the VHF channels 2 to 13, inclusive. In addition, the switch wafer S–4 is arranged to supply a B+ voltage to a UHF tuner output terminal 142, from which terminal the B+ voltage may be supplied to the plate circuit of the local oscillator tube of the associated UHF tuner (not shown).

Considering now the connections to the switch wafer S–1, a group of 12 radially extending stator contacts 150 to 161, inclusive, which are preferably of the flat blade type, are positioned by means of a stator ring indicated generally at 162 of insulating material. A center conductive ring 164, which is physically supported by means of radially extending arms 165 which are secured to the stator ring 162, is provided with radially extending end portions 166 and **166*a*. The end portion 166 is connected through a condenser 167 to the control grid of the RF amplifier tube 132. The antenna input network 130 is coupled through a channel 13 inductive increment 168 to the stator contact 150. Also, between individual ones of the contacts 150 to 156, inclusive, there is provided a series of six stamped inductive increments indicated generally at 170 to 175, inclusive, each of which is connected to the adjacent stator contacts by means of thin bendable sections, such as the sections 170*a* and 170*b*** which permit the inductive increment to be bent out of the plane of the stator contacts to provide for adjustment of individual inductance increments.

In order to connect individual inductive increments into the input circuit of the tube 132 so as to tune this input to successively lower frequency channels, there is provided a center rotor disc of insulating material indicated generally at 180, which carries a wiper 181 having a first set of contacts 182 adapted selectively to engage the inner ends of the stator contacts 150 to 161, inclusive, and a second pair of contacts 184 which are adapted to engage opposite sides of the ring 164. When the rotor 180 is in the position shown in full lines in FIG. 3 the channel 13 inductive increment 168 is connected to the input circuit of the tube 132 through the rotor wiper 181 and the capacitor 167. Also, as the rotor 180 is rotated in the counterclockwise direction as viewed in FIG. 3, additional ones of the inductive increments 170 will be inserted into the circuit to tune the input of the tube 132 to successively lower frequencies.

Tuning inductances for the channels corresponding to the stator contacts 157 through 161, inclusive, is provided by a series of multi-turn coils 190 to 194, inclusive, and these inductive increments are likewise inserted into the circuit for progressively lower frequency channels. However, when the switch S–1 is moved to the channel 1 position corresponding to UHF reception, the rotor contacts 182 and 184 are moved to the position shown in dotted lines in FIG. 3, in which position the ring 164 is connected to a thirteenth stator contact 198 so that a UHF–IF signal, which is supplied to the terminal 200 from the preceding UHF tuner, is coupled through an inductance 201, the stator contact 198, the wiper 181, the ring 164 and the arm portion 166 thereof to the input of the tube 132. By providing the particular switch construction described in connection with the wafer S–1, this changeover switching for UHF reception is achieved without requiring an additional switch wafer and while employing only 13 positions for the rotor 180.

Considering now the construction of the oscillator switch wafer S–4, this switch wafer includes a series of eleven stator contacts 150 to 160, inclusive, similar to the switch wafer S–1. However, in the switch wafer S–4 the stator contact 161*a* is longer than the corresponding stator contact 161 in the wafer S–1 and extends inwardly to a position in line with the ring 164 but insulated from this ring. Also, both radially extending end portions 166 and 166*a* are connected together and to the plate of the oscillator tube 136. B+ voltage for the oscillator tube 134 is supplied through a variable fine tuning inductance 202, a channel 13 inductance 204, the wiper 181 and the arm portion 166 of the ring 164 to the plate of the oscillator tube 136. A variable capacitor 203 is connected from the junction of the inductances 202 and 204 to ground. This junction is also connected through a capacitor 206 to the control grid of the oscillator tube 136, this control grid being connected to ground through a resistor 208. A fixed tuning capacitor 210 is connected from the plate of the oscillator tube 136 to ground.

The capacitor 206 and the tube capacities of the tube 136 provide a suitable feedback connection to the grid of the oscillator tube 136 so as to produce sustained oscillations in this tube for VHF operation. As the wiper 181 is moved to successive lower channel positions by rotation of the rotor 180 in the counterclockwise direction as viewed in FIG. 3, successive tuning increments 170, etc., are inserted into the oscillator tank circuit to lower the frequency thereof by the desired amount. However, when the rotor is moved to the channel 1 position, which is used for UHF reception, the wiper 181 is moved to the dotted line position shown in FIG. 3 and in this position the ring 164 is completely disconnected from the wiper 181 and instead the stator contact 198 is connected to the stator contact 161*a* through the wiper 181. When this occurs B+ voltage is supplied through the variable fine tuning inductance 202, the 12 channel tuning inductances, the wiper 181 the stator contact 198 to the terminal 142 so that a B+ potential is supplied to the plate circuit of the oscillator tube in the preceding UHF tuner. Furthermore, since the ring 164 has been disconnected from the wiper 181, B+ voltage is at the same time removed from the plate of the oscillator tube 136.

During VHF reception oscillations developed by the oscillator tube 136 are coupled through a capacitor 212 to the control grid of the mixer tube 134, this control grid being connected to ground through a resistor 214. In the plate circuit of the mixer tube 134 there is provided a variable tuning inductance 216 and a fixed inductance 218 which tune the plate circuit of this tube to the desired intermediate frequency, the junction of these inductances being connected to the IF output terminal 226. B+ voltage is supplied to the screen of the mixer tube 134 through a resistor 220 and a compensation coil 222, the junction of these two elements being connected to ground through the bypass capacitor 224. Accordingly, oscillations which are coupled through the condenser 212 are heterodyned with the RF signal applied to the grid of tube 134 through the interstage switch wafers 140 so that the desired IF frequency is produced at the terminal 226 during VHF reception. During UHF reception the oscillator tube 136 is deenergized in the manner described above by removing plate voltage therefrom and a B+ voltage is supplied to the preceding UHF tuner by way of the terminal 142. It will thus be seen that the particular construction of the switch wafers S–1 and S–4, described in detail heretofore, provides an arrangement whereby the necessary B+ and antenna input switching can be achieved by switch wafers which employ only 13 positions.

In the embodiment of FIG. 3 the mixer tube 134 and oscillator tube 136 are both connected to ground and are energized in parallel from the B+ supply. In FIG. 4 a further alternative arrangement is shown wherein the mixer and oscillator tubes 134*a* and 136*a* are connected in series to the B+ supply. Such an arrangement is particularly desirable in situations where a high B+ voltage is available from the television receiver proper. Referring to this figure, the switch wafer corresponding to the wafer S–4 of FIG. 3 is shown in expanded form and comprises the ring 164, the wiper 181 having the contacts 182 and 184 and the long stator contact 161*a* similar to that described in detail heretofore in connection with the wafer S–4.

During VHF reception B+ voltage is supplied through the fine tuning inductance 202, the channel 13 inductance 204, any additional inductance increments, the wiper 181, the ring 164 and the arm 166 to the plate of the oscillator tube 136*a*. However, the cathode of this tube is not connected to ground but instead is connected through a coil 232 and a variable inductance 216 to the plate of the mixer tube 134*a*, the cathode of this tube being connected to ground. The grid leak resistor 208 of the mixer tube 136*a* is connected between the grid and cathode of this tube and a bypass capacitor 224 is connected from the cathode of this tube to ground. Screen voltage for the mixer tube 134*a* is supplied through a compensating coil 222, as in the embodiment of FIG. 3.

Assuming a 280 volt B+ supply, during VHF reception the tuning inductances in the plate circuit of the oscillator tube 136*a* have very little resistance and hence the plate voltage on the tube 136*a* is also 280 volts. The oscillator tube 136*a* when it is oscillating produces a voltage drop such that the cathode voltage of this tube is 140 volts which acts as the plate voltage supply for the mixer tube 134*a*. A screen voltage of 140 volts is likewise applied to the screen of the mixer tube 134*a* under these conditions.

When the wiper 181 is moved to the UHF position shown in dotted lines in FIG. 4 the stator contact 161*a* is connected to the thirteenth position stator contact 198 so that B+ voltage is supplied through the fine tuning inductance 202 and the channel tuning inductances, the stator contact 161*a*, the wiper 181 and the contact 198 to the UHF B+ output terminal from which it is supplied to the plate circuit of the oscillator tube of the preceding UHF tuner. Since the stator contacts 161*a* and 198 are insulated from the ring 164 plate voltage is not supplied to the plate of the oscillator tube 136*a* over this path. However, in the embodiment of FIG. 4 a separate resistor 230 is connected from the B+ terminal directly to the plate of the oscillator tube 136*a*. The resistor 230 may have a value of approximately 40,000 ohms so that during VHF reception the resistance of this resistor is so large that it does not affect the above described operation during VHF reception. However, during UHF reception the resistor 230 acts as a dropping resistor so that plate voltage can still be supplied to the mixer tube 134*a* through the oscillator tube 136*a*, although this plate voltage is of reduced value so that the gain of the mixer tube 134*a* when this tube is operated as an IF amplifier for UHF reception is of the desired value. More particularly, when the resistor 230 is acting as the sole supply of B+ voltage to the tube 136*a*, the plate voltage on the tube 136*a* is 106 volts and the cathode voltage of this tube is 54 volts. A voltage of 54 volts is also supplied to the screen of the mixer tube 134*a* so that this tube can be operated as a low gain IF amplifier. In this connection it will be understood that the IF signal being transmitted through the interstage wafers 140 during UHF reception is supplied to the control grid of the tube 134*a* and amplified in this tube and supplied to the UHF–IF output terminal 226 in the manner described in detail heretofore in connection with the embodiment of FIG. 3.

It will be noted that in the embodiment of FIG. 4 the tuning inductances, such as the channel 13 tuning inductance 204, the increments 170 to 175 and tuning coils 190 to 194, are not connected in the plate circuit of the oscillator tube 136*a* in the UHF or channel 1 position. Accordingly, even though there is approximately 50 volts across the oscillator tube 136*a* in the UHF position, this tube does not oscillate to produce spurious and undesired oscillations in the VHF range which may interfere with the IF signal being amplified through the mixer-IF amplifier tube 134*a*. Thus, the oscillator tube 136*a* is employed to supply B+ voltage for the mixer tube when this tube is operating as an IF amplifier while positively preventing the development of undesired VHF oscillations in the plate circuit of the oscillator tube 136*a* during periods of UHF reception.

It will be noted that in the embodiments of FIGS. 2, 3 and 4, the use of a series fine tuning inductance, such as the inductance 130 of FIG. 2, or the inductance 202 of FIGS. 3 and 4, provides an arrangement wherein the plate voltage available for the oscillator is increased without requiring a higher value of B+ supply from the receiver. In conventional tuners, a voltage dropping resistor is normally connected between the B+ supply and the oscillator plate circuit and voltage drop in this plate supply resistor requires a larger B+ voltage. This is true both in the arrangement of FIG. 3 wherein the oscillator tube is connected between B+ and ground and also in the arrangement of FIG. 4 when the oscillator tube and mixer tubes are connected in series to the B+ supply. By employing the fine tuning inductance as a series connection to the oscillator plate circuit this inductance can act as a radio frequency choke so the desired oscillator voltage can be built up in the oscillator plate circuit while at the same time avoiding the voltage drop which is experienced when a plate dropping resistor is employed.

Furthermore, the use of the series fine tuning inductance in the manner described in detail heretofore permits a large value of B+ to be supplied to the oscillator circuit of the preceding UHF tuner. This provides an arrangement whereby the B+ voltage available for the local oscillator tube of the UHF tuner is a relatively large value and can be decreased by choosing a suitable value of dropping resistor in the UHF tuner so that oscillator tubes having different operating voltages can be accommodated. Thus, the VHF tuner of the present invention can be utilized with different types of UHF tuners which require different oscillator plate voltage supplies by simply using the correct value of dropping resistor for the B+ voltage in the UHF tuner.

It is also pointed out that when the series fine tuning inductance 202 is employed in the switch type tuners of FIGS. 3 and 4, an equalization effect is produced so that the range of variation of the local oscillator frequency which is produced by variation of the inductance 202 over its complete range is more uniform throughout the VHF band. This will be readily apparent when it is realized that as successively lower frequency channels are selected, more and more inductive increments are inserted in the plate circuit of the oscillator tube and the virtual ground point of these tuning increments will shift as more and more of the increments are inserted into the plate circuit. Shifting of this virtual ground effectively places the fine tuning inductance 202 across a variable portion of the oscillator tank circuit since the inductance 202 is connected from one side of this tank circuit, i.e., the channel 13 inductance 204, to an AC ground point, i.e., the B+ supply. Accordingly, the shift in local oscillator frequency produced by variation of the fine tuning inductance 202 remains substantially constant from high frequency to low frequency channels in the arrangements of FIGS. 3 and 4 due to the fact that the fine tuning inductance 202 is effectively connected across a variable portion of the oscillator tank circuit as successive increments are included in this tank circuit. This action is not present in the turret tuner arrangements of FIG. 2 because the position of the virtual ground of successive tuning coils 44 does not change and hence the fine tuning inductance 130 is connected across a fixed portion of the tank circuit for each channel.

Where there have been illustrated and described various embodiments of the present invention, it will be apparent that various changes and modifications thereof will occur to those skilled in the art. It is intended in the appended claims to cover all such changes and modifications as fall within the true spirit and scope of the present invention.

What is claimed as new and is desired to be secured by Letters Patent of the United States is:

1. In a television tuner, an oscillator circuit comprising an electron control device having an input electrode and an output electrode, a plurality of inductance tuning circuits corresponding to different television channels, means for selectively connecting different ones of said inductance tuning circuits in circuit with said input and output electrodes to produce sustained oscillations at a frequency determined by the selected inductance tuning circuit, a variable fine tuning inductance, means connecting said fine tuning inductance in series wtih a selected one of said inductance tuning circuits to said output electrode, and means also connecting said fine tuning inductance to an alternating current ground point, whereby variation of said fine tuning inductance is effective to vary the frequency of said oscillator circuit by a substantially fixed amount irrespective of the particular inductance tuning circuit which is selected.

2. In a television tuner, an oscillator circuit comprising an electron control device having an input electrode and an output electrode, a plurality of inductance tuning circuits corresponding to different television channels, means for selectively connecting different ones of said inductance tuning circuits in circuit with said input and output electrodes to produce sustained oscillations at a frequency determined by the selected inductance tuning circuit, a variable fine tuning inductance, a source of unidirectional potential, means connecting said fine tuning inductance and a selected one of said inductance tuning circuits in series circuit relation between said potential source and said output electrode, and means also connecting said fine tuning inductance to an alternating current ground point, whereby variation of said fine tuning inductance is effective to vary the frequency of said oscillator circuit by a substantially fixed amount irrespective of the particular inductance tuning circuit which is selected.

3. In a television tuner, an oscillator circuit comprising an electron control device having an input electrode and an output electrode, a plurality of inductance tuning circuits corresponding to different television channels, selector means having a number of positions for selectively connecting different ones of said inductance tuning circuits in circuit with said input and output electrodes to produce sustained oscillations at a frequency determined by the selected inductance tuning circuit said selector means having an additional position in which a unidirectional potential is to be supplied to an output terminal, a variable fine tuning inductance, a source of unidirectional potential, means connecting said fine tuning inductance in series with a selected one of said inductance tuning circuits between said source and said output electrode, whereby variation of said fine tuning inductance is effective to vary the frequency of said oscillator circuit by a substantially fixed amount irrespective of the particular inductance tuning circuit which is selected, and means for connecting said source through said fine tuning inductance to said output terminal when said selector means is in said additional position.

4. In a television tuner, an oscillator circuit comprising an electron control device having an input electrode and an output electrode, a plurality of inductance tuning circuits corresponding to different television channels, selector means having a number of positions for selectively connecting different ones of said inductance tuning circuits in circuit with said input and output electrodes to produce sustained oscillations at a frequency determined by the selected inductance tuning circuit said selector means having an additional position in which a unidirectional potential is to be supplied to an output terminal, a variable fine tuning inductance, a source of unidirectional potential, means connecting said fine tuning inductance in series with a selected one of said inductance tuning circuits between said source and said output electrode, whereby variation of said fine tuning inductance is effective to vary the frequency of said oscillator circuit by a substantially fixed amount irrespective of the particular inductance tuning circuit which is selected, and means for connecting said source through said fine tuning inductance to said output terminal when said selector means is in said additional position while at the same time disconnecting said output electrode from said source so that said sustained oscillations are not produced when said selector is in said additional position.

5. In a television tuner, a rotatable turret carrying a plurality of inductance tuning units, an oscillator circuit including an electron control device having an input electrode and an output electrode, a pair of stator contacts, means connecting one of said stator contacts to said output electrode, a variable fine tuning inductance, a source of unidirectional potential, means connecting said fine tuning inductance between said source and the other of said stator contacts, means responsive to rotation of said turret for selectively connecting different ones of said inductance tuning units to said pair of stator contacts, said turret having an additional position for UHF reception, thereby to connect said fine tuning inductance in series with a selected one of said inductance tuning units, said source of unidirectional potential also connecting one end of said fine tuning inductance to an alternating current ground point, a UHF output terminal, and means operative when said turret is in said additional position for connecting said potential source through said fine tuning inductance to said output terminal.

6. In a television tuner, a rotatable turret carrying a plurality of inductance tuning units, an oscillator circuit including an electron control device having an input electrode and an output electrode, a pair of stator contacts, means connecting one of said stator contacts to said output electrode, a variable fine tuning inductance, a source of unidirectional potential, means connecting said fine tuning inductance between said source and the other of said stator contacts, means responsive to rotation of said turret for selectively connecting different ones of said inductance tuning units to said pair of stator contacts, thereby to connect said fine tuning inductance in series with a selected one of said inductance tuning units, said source of unidirectional potential also connecting one end of said fine tuning inductance to an alternating current ground point, said turret having an additional position for UHF reception, a third stator contact, and means operative when said turret is in said additional position for connecting said source through said fine tuning inductance and said other stator contact to said third stator contact.

7. In a television tuner, an oscillator circuit including an electron control device having an input electrode and an output electrode, a selector switch having a stator and rotor of insulating material, a plurality of stator contacts positioned around said stator corresponding to television channels of different frequencies, a contact ring supported by said stator and positioned inside said stator contacts, contact means carried by said rotor for selectively connecting individual ones of said stator contacts to said contact ring, a plurality of tuning inductances connected between different ones of said stator contacts, means defining a gap in said contact ring, said plurality of stator contacts including a contact positioned in said gap and corresponding to the lowest frequency television channel, a source of unidirectional potential, means connecting said source to the highest frequency channel stator contact, means connecting said contact ring to the output electrode of said device, whereby successive ones of said tuning inductances may be connected in the output electrode circuit of said device upon rotation of said rotor to connect successive stator contacts to said contact ring, means connecting said output electrode circuit to said input electrode so that said device develops oscillations the frequency of which is determined by those ones of said tuning inductances which are included in said output electrode circuit, a UHF output terminal, means connecting one of said stator contacts to said UHF output terminal, and means operative when said selector switch is in a predetermined position for connecting said one stator contact to said lowest frequency channel stator contact, whereby said source is connected to said UHF output terminal through said tuning inductances in said predetermined position of said selector switch.

8. In a television tuner, an oscillator circuit including an electron control device having an input electrode and an output electrode, a selector switch having a stator and rotor of insulating material, a plurality of stator contacts positioned around said stator corresponding to television channels of different frequencies, a contact ring supported by said stator and positioned inside said stator contacts, contact means carried by said rotor for selectively connecting individual ones of said stator contacts to said contact ring, a plurality of tuning inductances connected between different ones of said stator contacts, means defining a gap in said contact ring, said plurality of stator contacts including a contact positioned in said gap and corresponding to the lowest frequency television channel, a source of unidirectional potential, means connecting said source to the highest frequency channel stator contact, means connecting said contact ring to the output electrode of said device, whereby successive ones of said tuning inductances may be connected in the output electrode circuit of said device upon rotation of said rotor to connect successive stator contacts to said contact ring, means connecting said output electrode circuit to said input electrode so that said device develops oscillations the frequency of which is determined by those ones of said tuning inductances which are included in said output electrode circuit, a UHF output terminal, means connecting one of said stator contacts to said UHF output terminal, said rotor contact means being operative in a predetermined position to connect said one stator contact to said lowest frequency channel stator contact independently of said contact ring, whereby said source is disconnected from said output electrode and is connected to said UHF output terminal through said tuning inductances in said predetermined position of said rotor.

9. In a television tuner, an oscillator circuit including an electron control device having an input electrode and an output electrode, a selector switch having a stator and rotor of insulating material, a group of thirteen stator contacts positioned substantially equidistantly around said stator, twelve of said stator contacts corresponding to VHF television channels and the thirteenth stator contact being utilized during UHF reception, a plurality of tuning inductances connected between said VHF stator contacts, a contact ring supported by said stator and connected to said output electrode, contact means carried by said rotor for selectively connected said VHF stator contacts to said contact ring, a voltage source connected to one of said stator contacts corresponding to the highest frequency VHF channel, means for coupling said output electrode to said input electrode so that said device develops oscillations, and means for connecting said UHF stator contact to the lowest frequency channel stator contact independently of said contact ring, thereby to deenergize said oscillator by disconnecting said source from said contact ring and to connect said source to said UHF stator contact for UHF reception.

10. In a television tuner, an oscillator circuit including an electron control device having an input electrode and an output electrode, a selector switch having a stator and rotor of insulating material, a group of thirteen stator contacts positioned substantially equidistantly around said stator, twelve of said stator contacts corresponding to VHF television channels and the thirteenth stator contact being utilized during UHF reception, a plurality of tuning inductances connected between said VHF stator contacts, a contact ring supported by said stator and connected to said output electrode, said contact ring being positioned inside said stator contacts and having a gap into which a first one of said stator contacts extends, said first stator contact corresponding to the lowest frequency VHF channel, contact means carried by said rotor for selectively connecting said VHF stator contacts to said contact ring, a voltage source connected to a second one of said stator contacts corresponding to the highest frequency VHF channel, means for coupling said output electcrode to said input electrode so that said device develops oscillations, and means for connecting said UHF stator contact to said first stator contact independently of said contact ring, thereby to deenergize said oscillator by disconnecting said source from said contact ring and to connect said source to said UHF stator contact for UHF reception.

11. In a television tuner, an oscillator circuit including an electron control device having an input electrode and an output electrode, a selector switch having an annular stator member of insulating material and a rotor of insulating material positioned within the central opening of said stator member, a group of thirteen blade-type stator contacts supported by said stator member and spaced substantially equidistantly therearound, said stator contacts including portions extending into the central opening of said stator member, twelve of said stator contacts corresponding to VHF television channels and the thirteenth stator contact being utilized for UHF reception, a plurality of tuning inductances connected between said UHF stator contacts, a flat contact ring supported by said stator member and connected to said output electrode, said contact ring being positioned in the central opening of said stator member and inside the inner edges of said stator contacts, said contact ring having a gap into which a first one of said blade type stator contacts extends, said first stator contact corresponding to the lowest frequency VHF channel, contact means carried by said rotor and including wiper means for selectively connecting said VHF stator contacts to said contact ring, a voltage source connected to a second one of said stator contacts corresponding to the highest frequency VHF channel, means for coupling said output electrode to said input electrode so that said device develops oscillations, said wiper means being effective in a predetermined position to connect said UHF stator contact to said first stator contact independently of said contact ring, whereby said voltage source is disconnected from said output electrode and is connected to said UHF stator contact through said tuning inductances in said predetermined position of said rotor.

12. In a television tuner, an oscillator circuit including an elecron control device having an input electrode and an output electrode, a selector switch having an annular stator member of insulating material and a rotor of insulating material positioned within the central opening of said stator member, a group of thirteen blade-type stator contacts supported by said stator member and spaced substantially equidistantly therearound, said stator contacts including portions extending into the central opening of said stator member, twelve of said stator contacts corresponding to VHF television channels and the thirteenth stator contact being utilized for UHF reception, a plurality of tuning inductances connected between said UHF stator contacts, a flat contact ring supported by said stator member and connected to said output electrode, said contact ring being positioned in the central opening of said stator member and inside the inner edges of said stator contacts, said contact ring having a gap into which a first one of said blade type stator contacts extends, said first stator contact corresponding to the lowest frequency VHF channel, contact means carried by said rotor and including wiper means for selectively connecting said VHF stator contacts to said contact ring, a voltage source, a variable fine tuning inductance, means connecting said voltage source through said fine tuning inductance to a second one of said stator contacts corresponding to the highest frequency VHF channel, means for coupling said output electrode to said input electrode so that said device develops oscillations, said wiper means being effective in a predetermined position to connect said UHF stator contact to said first stator contact independently of said contact ring, whereby said voltage source is disconnected from said output electrode and is connected to said UHF stator contact through said variable fine tuning inductance and tuning inductances in said predetermined position of said rotor.

13. In a television tuner, an oscillator circuit including an electron control device having an input electrode and an output electrode, a selector switch having an annular stator member of insulating material and a rotor of insulating material positioned within the central opening of said stator member, a group of thirteen blade-type stator contacts supported by said stator member and spaced substantially equidistantly therearound, said stator contacts including portions extending into the central opening of said stator member, twelve of said stator contacts corresponding to VHF television channels and the thirteenth stator contact being utilized for UHF reception, a plurality of tuning inductances connected between said UHF stator contacts, a flat contact ring positioned inside the inner edges of said stator contacts, a plurality of radially extending members secured to said stator member and connected to said ring for physically supporting the same and establishing electrical connection thereto, means connecting one of said radially extending members to said output electrode, said contact ring having a gap into which a first one of said blade-type stator contacts extends, said first stator contact corresponding to the lowest frequency VHF channel, contact means carried by said rotor and including wiper means for selectively connecting said VHF stator contacts to said contact ring, a voltage source connected to a second one of said stator contacts corresponding to the highest frequency VHF channel, means for coupling said output electrode to said input electrode so that said device develops oscillations, said wiper means being effective in a predetermined position to connect said UHF stator contact to said first stator contact independently of said contact ring, whereby said voltage source is disconnected from said output electrode and is connected to said UHF stator contact through said tuning inductances in said predetermined position of said rotor.

14. In a television tuner, an oscillator circuit including an electron control device having an input electrode and an output electrode, a selector switch having an annular stator member of insulating material and a rotor of insulating material positioned within the central opening of said stator member, a group of thirteen blade-type stator contacts supported by said stator member and spaced substantially equidistantly therearound, said stator contacts including portions extending into the central opening of said stator member, twelve of said stator contacts corresponding to VHF television channels and the thirteenth stator contact being utilized for UHF reception, a plurality of tuning inductances connected between said UHF stator contacts, a flat contact ring supported by said stator member and connected to said output electrode, said contact ring being positioned in the central opening of said stator member and inside the inner edges of said stator contacts, said contact ring having a gap into which a first one of said blade type stator contacts extends, said first stator contact corresponding to the lowest frequency VHF channel, contact means carried by said rotor and including a first pair of resilient fingers for selectively engaging opposite sides of said stator contacts as said rotor is rotated and a second pair of resilient fingers for engaging opposite sides of said contact ring, whereby said stator contacts are selectively connected to said contact ring upon rotation of said rotor, a voltage source connected to a second one of said stator contacts corresponding to the highest frequency VHF channel, means for coupling said output electrode to said input electrode so that said device develops oscillations, said first resilient fingers engaging said UHF stator contact and said second resilient fingers engaging said first stator contact without engaging said contact ring when said rotor is in a predetermined position, whereby said voltage source is disconnected from said output electrode and is connected to said UHF stator contact through said tuning inductances in said predetermined position of said rotor.

15. In a television tuner, an oscillator circuit including an electron control device having an input electrode and an output electrode, a selector switch having a stator and rotor of insulating material, a group of thirteen stator contacts positioned substantially equidistantly around said stator, twelve of said stator contacts corresponding to VHF television channels and the thirteenth stator contact being utilized during UHF reception, a plurality of tuning inductances connected between said VHF stator contacts, a contact ring supported by said stator and connected to said output electrode, contact means carried by said rotor for selectively connecting said VHF stator contacts to said contact ring, a voltage source, a variable fine tuning inductance, means connecting said fine tuning inductance between said voltage source and one of said stator contacts corresponding to the highest VHF channel, means for coupling said output electrode to said input electrode so that said device develops oscillations, and means for connecting said UHF stator contact to the lowest frequency channel stator contact independently of said contact ring, thereby to deenergize said oscillator by disconnecting said source from said contact ring and to connect said source to said UHF stator contact for UHF reception.

16. In a television tuner, an oscillator tube having an anode, grid and cathode, a selector switch having a stator and rotor, a group of thirteen stator contacts positioned substantially equidistantly around said stator, twelve of said stator contacts corresponding to VHF television channels and the thirteenth stator contact being utilized during UHF reception, a plurality of tuning inductances connected between said VHF stator contacts, a contact ring supported by said stator and connected to said anode, contact means carried by said rotor for selectively connecting said VHF stator contacts to said contact ring, a mixer tube, means connecting said mixer tube in series with the cathode of said oscillator tube, a voltage source connected to a first one of said stator contacts, corresponding to the highest frequency VHF channel, whereby said oscillator tube and said mixer tube are energized in series from said voltage source, means coupling said anode to said grid so that said oscillator tube develops oscillations utilized during VHF reception, means operative in a predetermined position of said selector switch for connecting said UHF stator contact to a second one of said stator contacts corresponding to the lowest frequency VHF channel and independent of said contact ring, and means permanently connected between said source and said anode for maintaining said mixer tube energized from said source through said oscillator tube while at the same time reducing the voltage between said anode and said cathode of said oscillator tube when said selector switch is in said predetermined position.

17. In a television tuner, an oscillator tube having an anode, grid and cathode, a selector switch having a stator and rotor, a group of thirteen stator contacts positioned substantially equidistantly around said stator, twelve of said stator contacts corresponding to VHF television channels and the thirteenth stator contact being utilized during UHF reception, a plurality of tuning inductances connected between said VHF stator contacts, a contact ring supported by said stator and connected to said anode, contact means carried by said rotor for selectively connecting said VHF stator contacts to said contact ring, a mixer tube, means connecting said mixer tube in series with the cathode of said oscillator tube, a voltage source connected to a first one of said stator contacts corresponding to the highest frequency VHF channel, whereby said oscillator tube and said mixer tube are energized in series from said voltage source, means coupling said anode to said grid so that said oscillator tube develops oscillations utilized during VHF reception, means operative in a predetermined position of said selector switch for connecting said UHF stator contact to a second one of said stator contacts corresponding to the lowest frequency VHF channel and independent of said contact ring, whereby said voltage source is connected to said UHF stator contact through said plurality of tuning inductances and said tuning inductances are disconnected from the anode circuit of said oscillator tube, and means permanently connected between said source and said anode for maintaining said mixer tube energized from said source through said oscillator tube while at the same time reducing the voltage between said anode and said cathode of said oscillator tube when said selector switch is in said predetermined position.

References Cited

UNITED STATES PATENTS

| | | | |
|---|---|---|---|
| 2,719,916 | 10/1955 | Winfield | 325—439 |
| 2,806,945 | 9/1957 | Wingert | 325—465 |
| 2,811,637 | 10/1957 | O'Brien | 325—465 |
| 2,835,798 | 5/1958 | Hermeling | 325—465 |

KATHLEEN H. CLAFFY, *Primary Examiner.*

R. P. TAYLOR, *Assistant Examiner.*

UNITED STATES PATENT OFFICE
CERTIFICATE OF CORRECTION

Patent No. 3,333,202 July 25, 1967

Alarico A. Valdettaro

It is hereby certified that error appears in the above numbered patent requiring correction and that the said Letters Patent should read as corrected below.

Column 13, line 12, for "connected" read -- connecting --; column 14, line 7, for "elecron" read -- electron --; column 16, line 10, after "contacts" strike out the comma.

Signed and sealed this 24th day of September 1968.

(SEAL)
Attest:

Edward M. Fletcher, Jr.
Attesting Officer

EDWARD J. BRENNER
Commissioner of Patents